United States Patent [19]

Wu

[11] Patent Number: 5,053,347
[45] Date of Patent: Oct. 1, 1991

[54] AMORPHOUS SILICON THIN FILM TRANSISTOR WITH A DEPLETION GATE

[75] Inventor: Biing-Seng Wu, Tainan, Taiwan

[73] Assignee: Industrial Technology Research Institute, Taiwan

[21] Appl. No.: 480,475

[22] Filed: Feb. 14, 1990

Related U.S. Application Data

[63] Continuation-in-part of Ser. No. 389,227, Aug. 3, 1989.

[51] Int. Cl.⁵ .......................................... H01L 29/78
[52] U.S. Cl. ...................................... 437/40; 437/101; 357/23.7
[58] Field of Search ................... 437/40, 41, 101, 187; 357/23.7, 59 B, 4, 2; 350/333

[56] References Cited

U.S. PATENT DOCUMENTS

| | | | |
|---|---|---|---|
| 3,500,137 | 3/1970 | Schroen et al. | 357/51 |
| 4,040,073 | 8/1977 | Luo | 357/23.7 |
| 4,422,090 | 12/1983 | Shepherd et al. | 357/23.7 |
| 4,720,736 | 1/1988 | Takafuji | 357/23.7 |
| 4,723,838 | 2/1988 | Aoki et al. | 357/23.7 |
| 4,776,673 | 10/1988 | Aoki | 357/23.7 |
| 4,788,157 | 11/1988 | Nakamura | 357/23.7 |
| 4,821,092 | 4/1989 | Noguchi | 357/23.7 |
| 4,864,376 | 9/1989 | Aoki et al. | 357/4 |
| 4,885,616 | 12/1989 | Ohta | 357/23.7 |
| 4,889,983 | 12/1989 | Numano et al. | 357/2 |
| 4,938,567 | 7/1990 | Chartier | 350/333 |

FOREIGN PATENT DOCUMENTS

| | | | |
|---|---|---|---|
| 0299185 | 1/1989 | European Pat. Off. | 357/23.7 |
| 0224165 | 12/1984 | Japan | 357/23.7 |
| 0083370 | 5/1985 | Japan | 357/23.7 |
| 0092663 | 5/1985 | Japan | 357/23.7 |
| 0224278 | 11/1985 | Japan | 357/23.7 |
| 0115868 | 5/1987 | Japan | 437/41 |
| 0149472 | 6/1989 | Japan | 357/23.7 |
| 2185622 | 7/1987 | United Kingdom | 357/23.7 |

OTHER PUBLICATIONS

"Thin Film Transistors with Low Contact Resistance Prepared by Selective Tungsten Deposition Technology", IBM Technical Disclosure Bulletin, vol. 32, No. 1, Jun. 1989, pp. 164–165.

Fang, "TFT Structure with Electronically Adjustable Threshold", IBM Technical Disclosure Bulletin, vol. 20, No. 12, May 1978, p. 5352.

"Anomalous Leakage Current in LPCVD Polysilicon MOSFETs", Fossem et al., IEEE Transaction on Electronic Devices, vol. ED-32, No. 9, p. 1879 (1985).

"Analysis and Design of a-Si TFT/LCD Panels with a Pixal Model", Kaneke et al., IEEE Transaction on Electronic Devices, vol. 36, p. 2953 (1989).

*Primary Examiner*—Olik Chaudhuri
*Assistant Examiner*—M. Wilczewski
*Attorney, Agent, or Firm*—Darby & Darby

[57] ABSTRACT

The present invention is a high speed thin film transistor with an accumulation gate and a depletion gate. When a positive voltage is applied to the accumulation gate, the electrons are accumulated in the channel region of the accumulation gate and the transistor is operated at the "on" state. If a negative voltage is applied to the depletion gate, the accumulated electrons are depleted, and the transistor is operated at the "off" state. The on-current of the thin film transistor is the same as the conventional thin film transistors; however, a smaller off-current of the transistor is obtained.

6 Claims, 7 Drawing Sheets

AMORPHOUS SILICON THIN FILM TRANSISTOR WITH A DEPLETION GATE

RELATED APPLICATION

This application is a continuation-in-part of copending U.S. patent application Ser. No. 389,227, filed Aug. 3, 1989.

BACKGROUND OF THE INVENTION

The various known techniques for making thin film transistors (TFTs), particularly the staggered type amorphous silicon (a-Si) thin film transistors, lead inevitably to causing the transistor gate or "grid" to be overlapped by its source and drain. The grid length $1a$ equals the summation of the channel length La, source/grid overlap $1s$, and drain/grid overlap $1d$, as shown in FIG. 1. The large grid length and the overlaps introduce stray capacitance, which increases the response time of the thin film transistor. Hence, the operation frequency of the a-Si logic integrated circuit is restrained. Moreover, because of the charge redistribution between the stray capacitance and the load capacitance, the signal on the grid can couple to the load. This effect can introduce an unacceptable DC voltage level when these components are used in liquid crystal display devices, and cause a voltage shift when these components are used in logic integrated circuits. In order to reduce the charge redistribution effect, a storage capacitor is connected in parallel with the liquid crystal cell of logic integrated circuit (the load). However, the parallel storage capacitor reduces the operating speed of the transistor and it can restrain the number of scan line in liquid crystal display.

Recently many new thin film transistor manufacturing processes for metal insulator semiconductor field effect transistors (MISFETs) have been proposed enabling the transistor grid to be aligned with the drain and source, thus eliminating the overlap capacitances almost entirely. Such processes have been described in the article in *IEEE Electron Device Letters*, Vol. EDL-3, No. 7 (July 1982), entitled "A Self-Alignment Process for Amorphous Silicon Thin Film Transistors," by T. Kodama et al. and in U.S. Pat. No. 4,587,720 (May 13, 1986) entitled "Process for the Manufacture of a Self-Aligned Thin-Film Transistor" by Chenevas-Paule et al. These manufacturing techniques employ a photoresist lift-off process to form the source and drain regions. When the lift-off process is used to fabricate the a-Si thin film transistors, the n+ a-Si layer is deposited on photoresist. The deposition temperature of the n+ a-Si layer is higher than 200° C., and therefore a high temperature photoresist must be used.

The a-Si metal semiconductor field effect transistor (MESFET) was also fabricated. There is a space between the grid and the source (or drain) of the MESFET. Therefore, the stray capacitance can be eliminated entirely. Such a device was described in an article in the *Japanese Journal of Applied Physics*, Vol. 24, No. 8 (Aug., 1985), pp. L632–L634, entitled "MES-FETs Fabricated on Doped a-Si Films" by K. Okamoto et al. However, the thickness of the active layer is very critical. With too thick an active layer, the FET cannot be switched off. With too thin an active layer, the on-current and the transconductance of the FET degrade drastically. Moreover, the high leakage current and low breakdown voltage of the a-Si Schottky gate diode make the device exhibit high gate current and low operation gate voltage, causing the transistor to exhibit a high off-current.

SUMMARY OF THE INVENTION

The object of the present invention is the structure of and the process for producing a thin film transistor having the merits of both an MES-TFT and an MIS-TFT. The device has an accumulation gate on the bottom of the active semiconductor layer and a depletion gate on the top of the active semiconductor layer. The gate length of the depletion gate is smaller than that of the accumulation gate. The layout of the thin film transistor is shown in FIG. 2.

The process for producing a thin film transistor with accumulation and depletion gates includes the following steps:

(a) producing the accumulation gate electrode on a substrate of glass (FIG. 3);

(b) depositing an insulating layer (bottom insulator) on the substrate and electrode (FIG. 4);

(c) depositing a hydrogenated amorphous silicon layer on the insulating layer (FIG. 4);

(d) depositing an insulating layer (top insulator) on the amorphous silicon layer (FIG. 4);

(e) depositing and developing a photoresist layer to define the source and drain region (FIG. 4);

(f) etching the top insulating layer until the a-Si layer is bare (FIG. 5);

(g) eliminating the remaining photoresist (FIG. 6);

(h) depositing n+ a-Si film as the ohmic-contact layer of the transistor (FIG. 7);

(i) depositing and developing a photoresist layer on the n+ a-Si layer (FIG. 7);

(j) etching the n+ a-Si:H layer and undoped a-Si:H layer until the top insulator 10 between the source-drain region and the bottom insulator 6 beyond the TFT region is bare (FIG. 8);

(k) eliminating the remaining photoresist (FIG. 9);

(l) depositing and developing a photoresist layer for the contact hole of the accumulation gate (refer to FIG. 2 and FIG. 10);

(m) etching the bottom insulator until the contact region of the accumulation gate is bare (FIG. 10);

(n) eliminating the remaining photoresist (FIG. 11);

(o) depositing metal film on the entire wafer (FIG. 12);

(p) depositing and developing a photoresist layer for the source-drain contact, the depletion gate electrode, and the accumulation gate electrode (FIG. 2 and FIG. 13);

(q) etching the metal film to form the depletion gate electrode, the accumulation gate electrode and the source-drain electrode (FIG. 14); and (r) eliminating the remaining photoresist (FIG. 15).

The depletion gate electrode and source-drain contact electrodes and the accumulation gate electrode are produced simultaneously and so there are no additional process steps relative to conventional TFT manufacturing.

In operation, the accumulation gate is positive biased and the depletion gate is negative biased with respect to the source electrode. When the accumulation gate is biased and the depletion gate is floating or zero biased, the electrons are accumulated in the active layer (i.e., undoped layer), and the TFT is at the on-state. When the accumulation gate and depletion gate are biased simultaneously, the accumulated electrons below the depletion gate are depleted, and the drain current of the TFT decreases. If the bias of the depletion gate is increased further, the undoped layer below the depletion gate is in the deep depletion condition, and the TFT is in the off-state. In the off state, there are no conductive electrons in the deep depletion region, and therefore the off-current of the TFT of the invention is much smaller than that of a conventional a-Si TFT (which is controlled by the sheet resistance of the undoped layer). In addition, the vertical field (which increases with the voltage difference between top gate and bottom gate) is much larger than the horizontal field (which increases with the drain to source voltage); hence the clearance between the depletion gate and the drain region does not change the current-voltage characteristic of the device; i.e., the clearance does not affect the threshold voltage of the TFT of the invention.

FIG. 16 shows the transfer characteristics of the invention under the following bias conditions: (1) drain voltage=5 V to 9 V; (2) source voltage=0 V; (3) the accumulation gate is biased from −5 V to 20 V; and (4) the depletion gate is floating, i.e., it is biased as in a conventional thin film transistor. The "off-current" is larger than 1 pA. FIG. 17 shows the transfer characteristics of the invention under a drain voltage of 5 V. Each line in this figure responds to a bias on the accumulation gate of 5 V, 10 V, 15 V, 20 V, 25 V, respectively; and the depletion gate is biased from 10 V to −30 V. The "on-current" is the same as that of conventional TFT; however, the "off-current" can be reduced to 0.1 pA, which is one order of magnitude less than that of a conventional amorphous silicon thin film transistor under conventional bias condition.

The Id versus Vd characteristics under an accumulation gate bias of 25 V is shown in FIG. 18. The I-V characteristic is very similar to that of conventional TFT except for the bias conditions.

It is expected that the device performance can be improved beyond the performance levels illustrated in FIGS. 16-18.

DESCRIPTION OF THE PREFERRED EMBODIMENT

Figure 1:
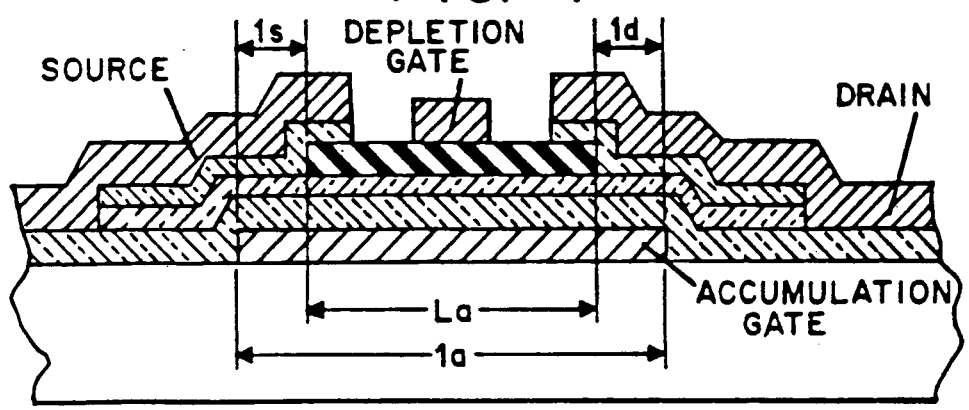
FIG. 1 is a cross-sectional view of a device embodying the invention, showing that the grid length of the accumulation gate 1a equals the sum of the accumulation channel length La, the source/grid overlap 1s, and the drain/grid overlap 1d, which is much larger than the channel length of depletion gate.
Figure 2:
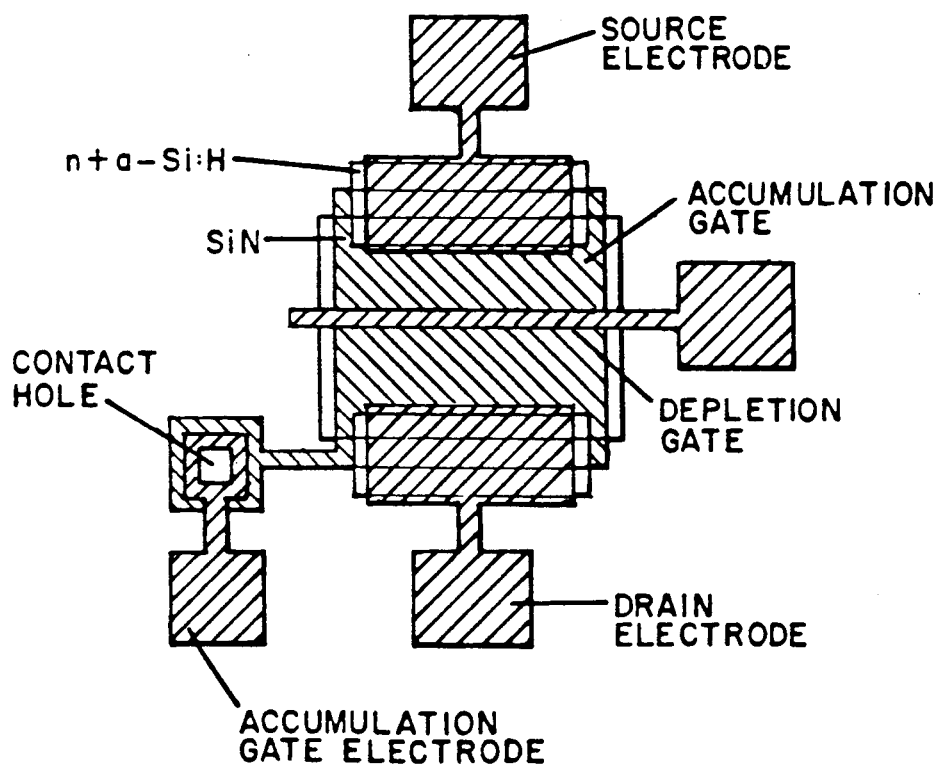
FIG. 2 is the layout (or top view) of the depletion gate TFT. A contact hole is opened for the accumulation gate.
Figure 3:
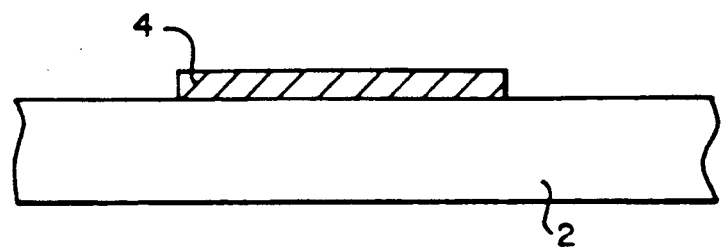
FIGS. 3 through 15 illustrate successive steps in fabricating a device embodying the invention in chronological order and are cross-sectional views of the device in successive stages of fabrication.

As represented in FIG. 3, the first step of the process for making the invention consists in making the accumulation gate 4 on the glass substrate 2, using classical methods of photolithography (masking and etching). The accumulation gate 4, having for example a thickness of 2000 Angstroms, is made preferably of chromium.

Figure 4:
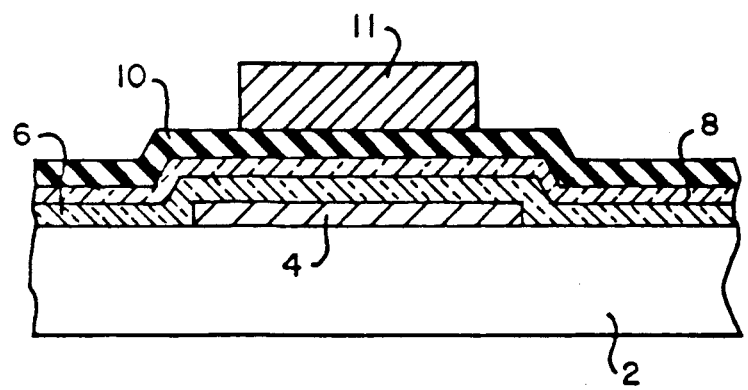
Figure 5:
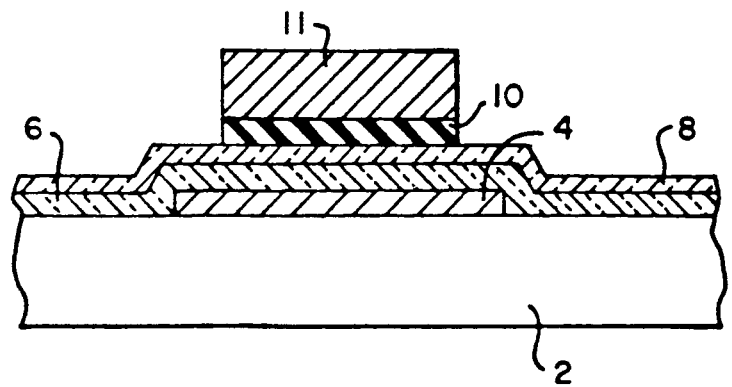
Figure 6:
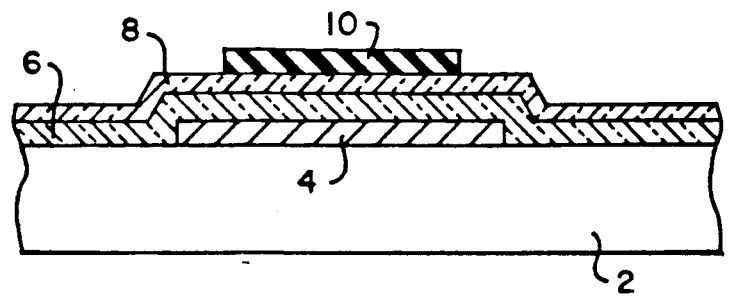
Figure 7:
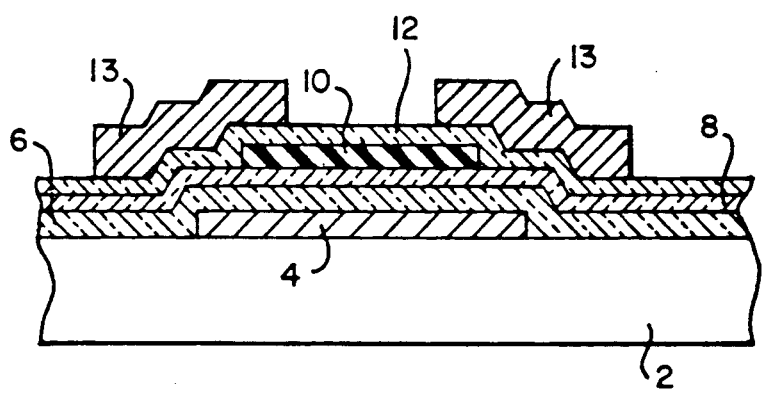
Figure 8:
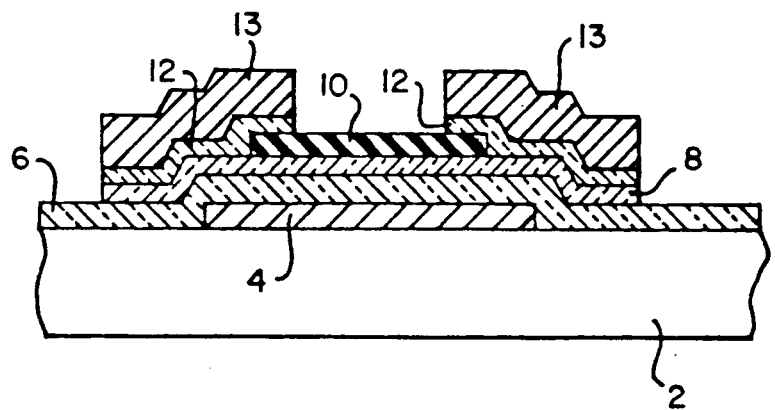
Figure 9:
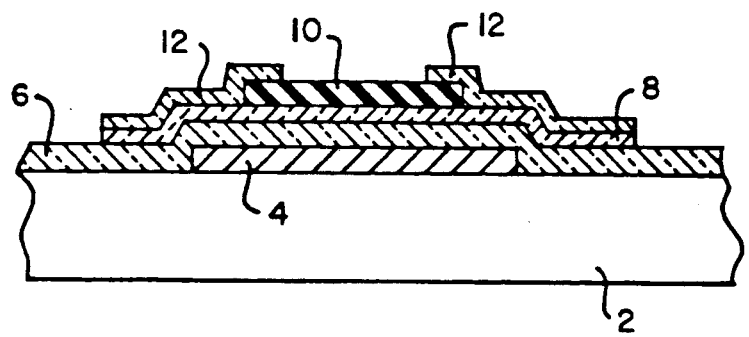
Figure 10:
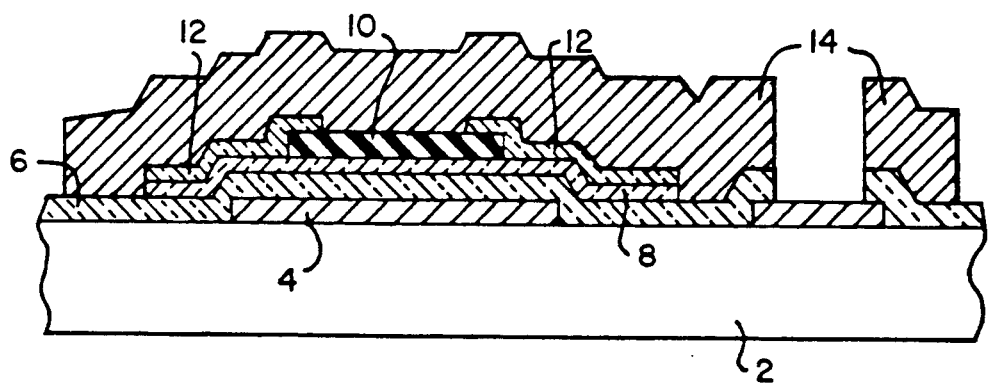
Figure 11:
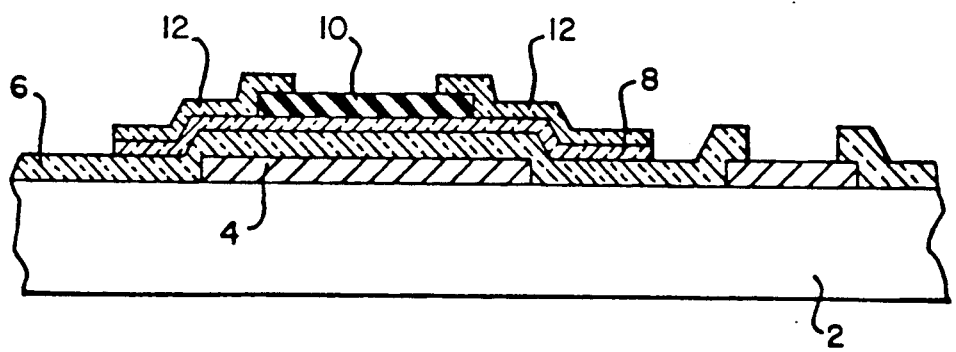
Figure 12:
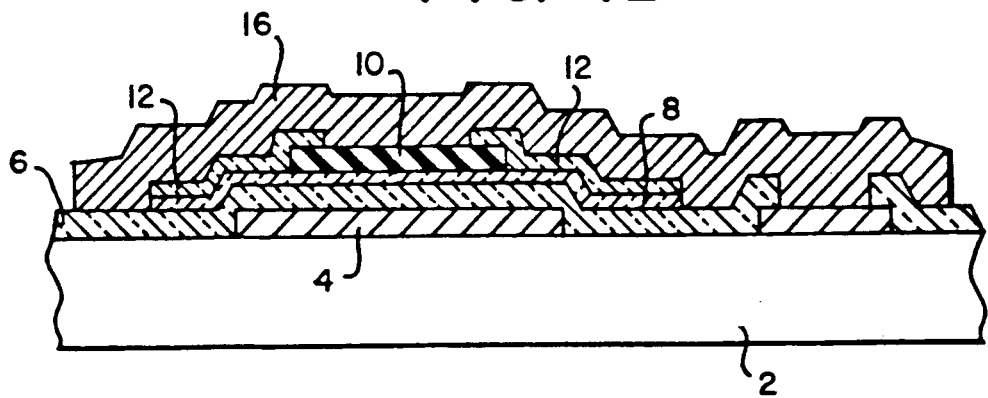
Figure 13:
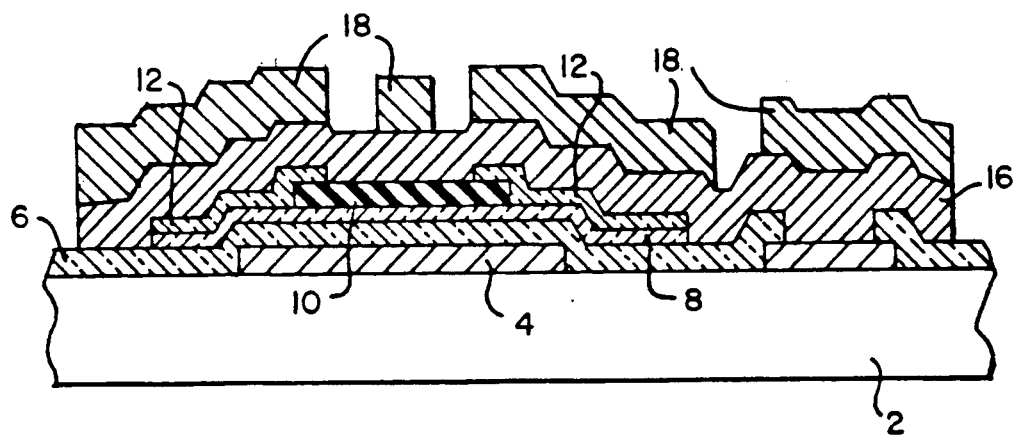
Figure 14:
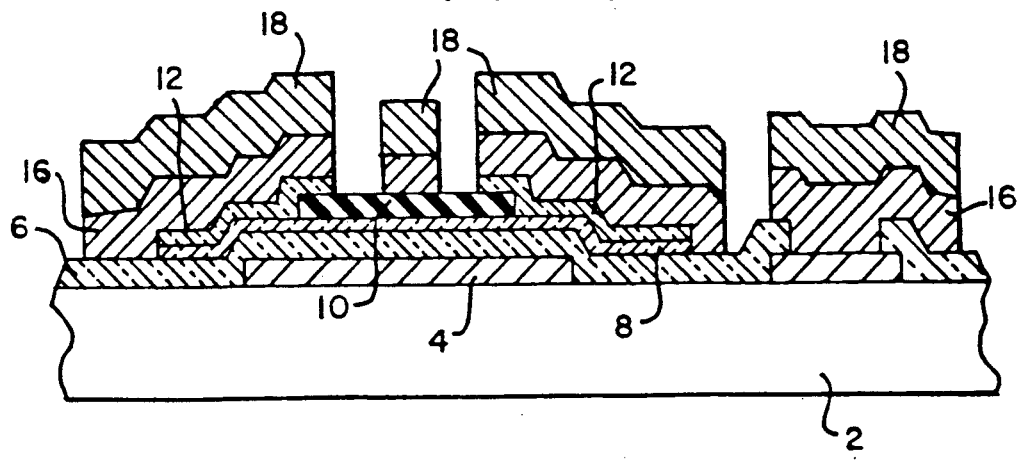
Figure 15:
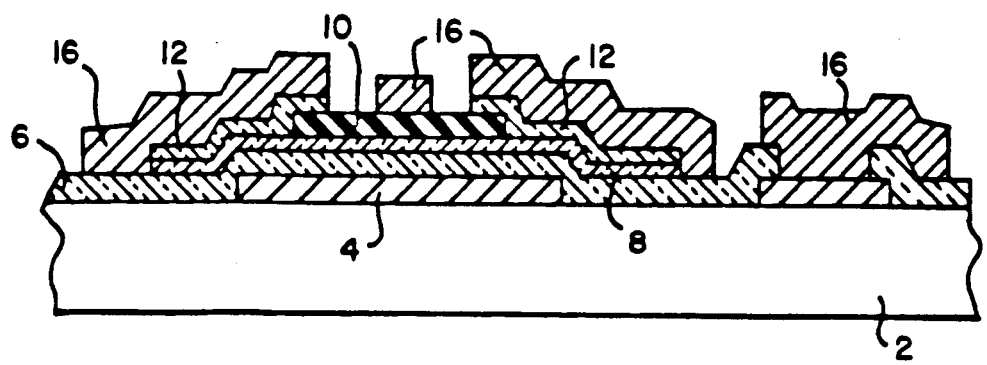
Figure 16:
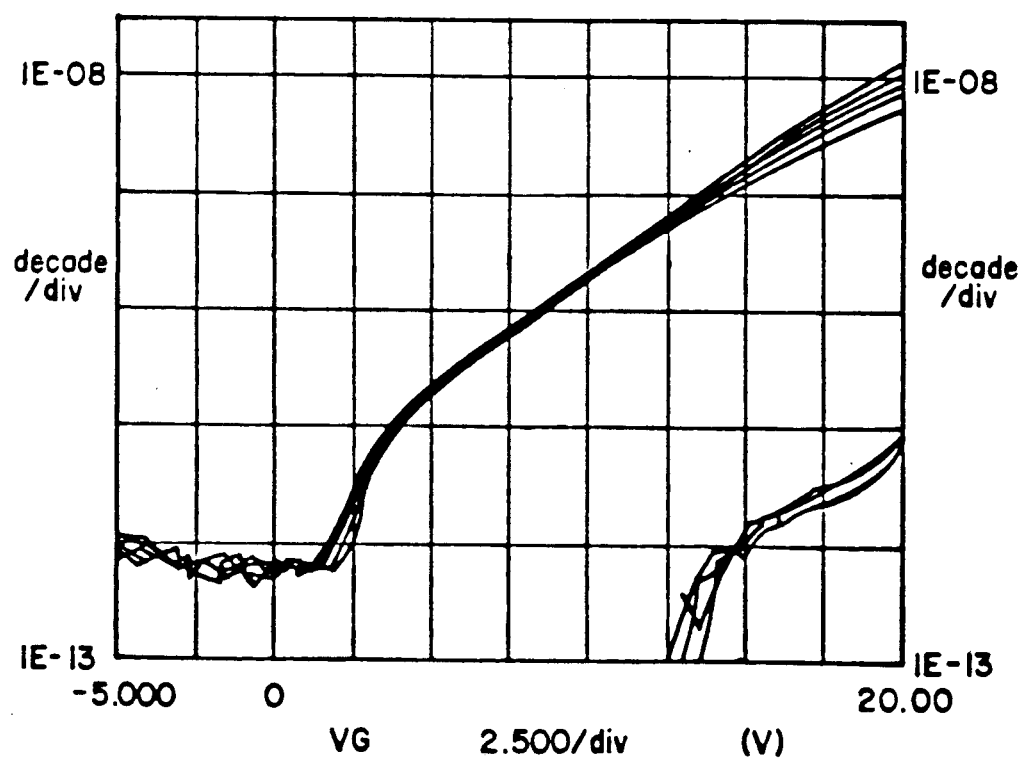
FIG. 16 is a graph illustrating the transfer characteristics of TFT under the conventional operation mode, i.e., whenever the depletion gate is floating.
Figure 17:
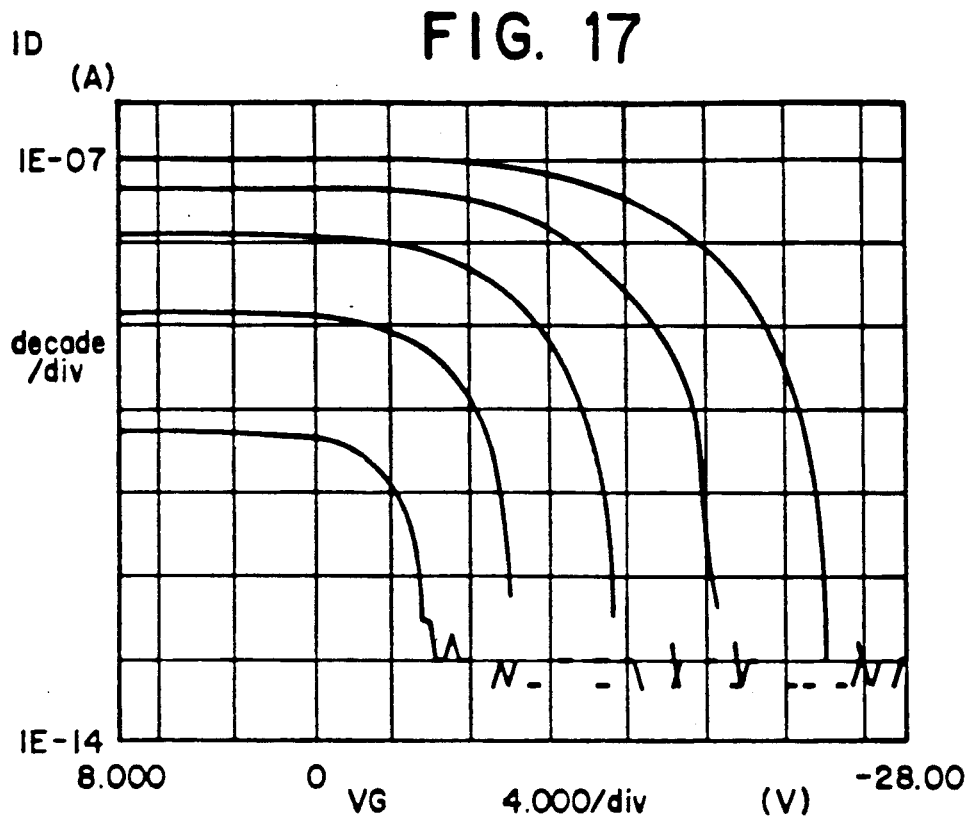
FIG. 17 is a graph illustrating the transfer characteristics of the TFT under the bias conditions in accordance with the invention.
Figure 18:
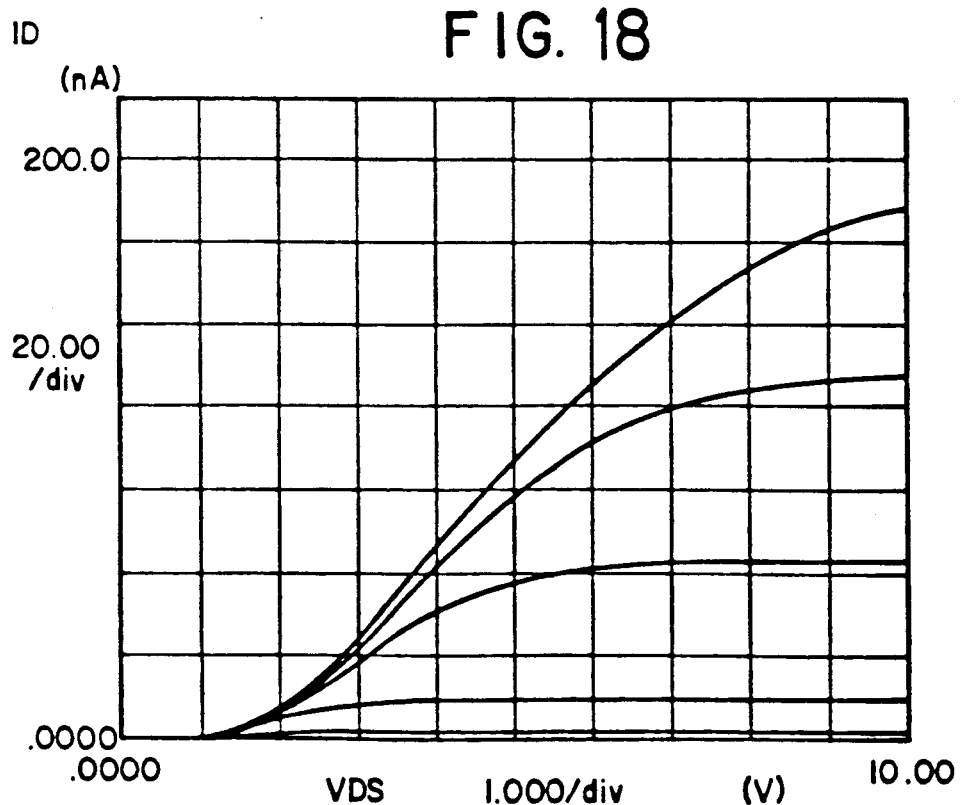
FIG. 18 is a graph illustrating the Id versus Vd characteristics of the TFT under the bias conditions in accordance with the invention.

Then, as shown in FIG. 4, a bottom insulating layer 6, undoped amorphous silicon layer 8, and top insulating layer 10 are grown successively in one pump-down period. Both the insulating layers 6, 10 and undoped amorphous silicon layer 8 are made of plasma enhanced chemical vapor deposition (PECVD), and have the thickness of 2000 Angstroms. The undoped layer 8 has a thickness of 1000 Angstroms. Next, a layer 11 of photoresist is deposited and photolithographically developed on top of the insulating layer 10, as shown in FIG. 4. The insulating layer 10 is etched to remove all but that portion underlying the photoresist layer 11, so that contact regions of source and drain are opened, as shown in FIG. 5. The photoresist layer 11 is then removed, as shown in FIG. 6. A phosphorous doped amorphous silicon layer 12 with a thickness of 500 angstroms is then deposited as the contact layer of source and drain, as shown in FIG. 7. A photoresist layer 13 is photolithographically deposited and developed on top of the amorphous silicon layer 12, as shown in FIG. 7. Then, the amorphous silicon layer 12 is etched to remove all but that portion underlying the photoresist layer 13, as shown in FIG. 8. The photoresist layer 13 is removed, as shown in FIG. 9. Next, a photoresist layer 14 is deposited and developed on entire wafer 10. The bottom insulating layer 6 is then etched to remove all but that portion protected by the photoresist layer 14, forming an opening (i.e. contact hole 15) to the accumulation gate 4, as shown in FIG. 10. The photoresist 14 is then removed, as shown in FIG. 11. Next, a metal film 16 is deposited on the entire wafer by sputtering, as shown in FIG. 12. Then a photoresist layer 18 is deposited and developed on the metal film 16, as shown in FIG. 13. The metal film 16 is then etched to remove all but those portions underlying the photoresist layer 18, thus forming the source/drain metallization, the interconnection of the accumulation gate electrode and the depletion gate electrode, as shown in FIG. 14. Finally, the photoresist layer 18 is removed to complete the device, as shown in FIG. 15.

While the invention has been described in detail by reference to preferred embodiments thereof, it is understood that variations and modifications may be made without departing from the true spirit and scope of the invention.

What is claimed is:

1. A process for fabricating an amorphous silicon thin film transistor, comprising the steps of:
    (a) forming an accumulation gate on a substrate;
    (b) depositing a bottom insulating layer on the substrate and the accumulation gate;
    (c) depositing a hydrogenated amorphous silicon (a-Si) channel layer on the bottom insulating layer;
    (d) depositing a top insulating layer on the amorphous silicon channel layer;
    (e) partially removing said top insulating layer so as to expose separate source and drain regions of said channel layer;

(f) depositing a doped a-Si film of a first conductivity type as the ohmic-contact layer of the transistor;

(g) partially removing the doped a-Si film to expose an intermediate portion of the top insulator between the separate source and drain regions of the channel layer, so as to form separate source and drain ohmic contact layers overlying, respectively, said source and drain regions of said channel layer, and removing remaining parts of the doped a-Si film and the undoped a-Si layer outside the defined active region to expose portions of the bottom insulating layer, so as to define the active region of the transistor;

(h) partially removing the bottom insulator to expose a contact hole of the accumulation gate;

(i) depositing a metal film over said source and drain ohmic contact layers, said top insulation layer and the accumulation contact hole;

(j) partially removing the metal film so as to form a depletion gate electrode on said intermediate portion of said top insulating layer, source and drain electrodes on said source and drain ohmic contact layers, and the interconnection of the accumulation gate electrode.

2. The process of claim 1 wherein step (g) removes a portion of said amorphous silicon channel layer, whereby the accumulation gate is overlapped with the source and drain regions.

3. The process of claim 1 wherein step (b) comprises depositing PECVD amorphous silicon nitride or PECVD amorphous silicon oxide or low temperature oxide.

4. The process of claim 1 wherein step (d) comprises depositing PECVD amorphous silicon nitride or PECVD amorphous silicon oxide or low temperature oxide.

5. The process of claim 1 wherein step (g) removes a sufficient portion of said ohmic contact layer so that the depletion gate is smaller than the distance between the source and drain ohmic contact layers.

6. The process of claim 1 wherein the doped ohmic contact layer comprises either n+ or p+ conductivity type amorphous silicon, and the thin film transistor has either an electron or a hole conductive channel, respectively.

* * * * *